United States Patent
Clark, Jr. et al.

(10) Patent No.: US 9,041,105 B2
(45) Date of Patent: May 26, 2015

(54) INTEGRATED CIRCUIT INCLUDING TRANSISTOR STRUCTURE ON DEPLETED SILICON-ON-INSULATOR, RELATED METHOD AND DESIGN STRUCTURE

(75) Inventors: William F. Clark, Jr., Essex Junction, VT (US); Qizhi Liu, Lexington, MA (US); Robert M. Rassel, Colchester, VT (US); Yun Shi, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 222 days.

(21) Appl. No.: 13/553,947

(22) Filed: Jul. 20, 2012

(65) Prior Publication Data

US 2014/0021547 A1    Jan. 23, 2014

(51) Int. Cl.
  *H01L 27/088* (2006.01)
  *H01L 27/12* (2006.01)
  *H01L 21/84* (2006.01)
  *H01L 21/265* (2006.01)

(52) U.S. Cl.
  CPC ............ *H01L 27/1203* (2013.01); *H01L 21/84* (2013.01)

(58) Field of Classification Search
  CPC ............... H01L 21/7624; H01L 21/76264; H01L 21/8249; H01L 21/84; H01L 27/0623; H01L 27/1203; H01L 29/66674; H01L 29/66681; H01L 29/7801; H01L 29/7816; H01L 29/7824
  USPC ................................... 257/347; 438/514, 479
  See application file for complete search history.

(56) References Cited

U.S. PATENT DOCUMENTS

| | | | | |
|---|---|---|---|---|
| 5,049,513 A | * | 9/1991 | Eklund | 438/154 |
| 5,110,749 A | * | 5/1992 | Ikeda | 438/322 |
| 5,338,965 A | | 8/1994 | Malhi | |
| 5,344,785 A | * | 9/1994 | Jerome et al. | 438/311 |
| 6,614,077 B2 | | 9/2003 | Nakamura et al. | |
| 6,825,531 B1 | | 11/2004 | Mallikarjunaswamy | |
| 7,476,574 B2 | | 1/2009 | Marty et al. | |
| 7,575,977 B2 | * | 8/2009 | Levin et al. | 438/286 |
| 7,732,864 B2 | * | 6/2010 | Kawahara et al. | 257/347 |
| 7,939,395 B2 | | 5/2011 | Abadeer et al. | |
| 2003/0168680 A1 | * | 9/2003 | Hsu | 257/296 |
| 2006/0134845 A1 | * | 6/2006 | Pham et al. | 438/200 |
| 2006/0231899 A1 | | 10/2006 | Chang et al. | |
| 2007/0018273 A1 | * | 1/2007 | Miller et al. | 257/506 |
| 2008/0203403 A1 | * | 8/2008 | Kawahara et al. | 257/80 |
| 2009/0212329 A1 | | 8/2009 | Ieong et al. | |
| 2009/0218632 A1 | | 9/2009 | Cheng | |
| 2010/0102388 A1 | * | 4/2010 | Levin et al. | 257/343 |
| 2010/0117153 A1 | * | 5/2010 | Lucking et al. | 257/351 |

(Continued)

*Primary Examiner* — Khiem D Nguyen
*Assistant Examiner* — Pauline Vu
(74) *Attorney, Agent, or Firm* — Michael LeStrange; Hoffman Warnick LLC (57) ABSTRACT

An Integrated Circuit (IC) and a method of making the same. In one embodiment, the IC includes: a substrate; a first semiconductor layer disposed on the substrate; a shallow trench isolation (STI) extending through the first semiconductor layer to within a portion of the substrate, the STI substantially separating a first n+ region and a second n+ region; and a gate disposed on a portion of the first semiconductor layer and connected to the STI, the gate including: a buried metal oxide (BOX) layer disposed on the first semiconductor layer and connected to the STI; a cap layer disposed on the BOX layer; and a p-type well component disposed within the first semiconductor layer and the substrate, the p-type well component connected to the second n+ region.

12 Claims, 10 Drawing Sheets

(56) References Cited

U.S. PATENT DOCUMENTS

| | | |
|---|---|---|
| 2011/0042745 A1 | 2/2011 | Negoro |
| 2012/0187481 A1* | 7/2012 | Mallikarjunaswamy ...... 257/334 |
| 2013/0234244 A1* | 9/2013 | Liu et al. ...................... 257/334 |
| 2013/0277753 A1* | 10/2013 | Clark et al. .................... 257/378 |

* cited by examiner

INTEGRATED CIRCUIT INCLUDING TRANSISTOR STRUCTURE ON DEPLETED SILICON-ON-INSULATOR, RELATED METHOD AND DESIGN STRUCTURE

FIELD OF THE INVENTION

The disclosure relates generally to integrated circuit (IC) chips and fabrication, and more particularly, to an IC including a high voltage (e.g., greater than about 1 volt) component disposed on and/or within a depleted silicon-on-insulator (SOI) wafer, a related method of forming, and a design structure.

BACKGROUND

In integrated circuit (IC) design, a plurality of materials, orientations, and components may be employed by designers to customize and create various ICs. These designs may include the use of field effect transistors (FET), laterally diffused metal oxide semiconductors (LDMOS), and many other kinds of components and materials. Standard ICs may include silicon-on-insulator (SOI) and/or LDMOS components which may have limited abilities to handle high voltage values (e.g., greater than about 1 volt). In some ICs, designers have begun to reduce wafer and component sizes, increasing the flexibility and versatility of the chips and the applications for which they may be used. However, as device size and/or wafer thickness decreases, the maximum allowable voltage of these ICs may be significantly decreased. These limitations on device size and voltage tolerance may lead to limited IC design options, IC functionality, and/or IC failure during or following fabrication.

BRIEF SUMMARY

A first aspect of the disclosure provides an integrated circuit including: a substrate; a first semiconductor layer disposed on the substrate; a shallow trench isolation (STI) extending through the first semiconductor layer to within a portion of the substrate, the STI substantially separating a first n+ region and a second n+ region; and a gate disposed on a portion of the first semiconductor layer and connected to the STI, the gate including: a buried metal oxide (BOX) layer disposed on the first semiconductor layer and connected to the STI; a cap layer disposed on the BOX layer; and a p-type well component disposed within the first semiconductor layer and the substrate, the p-type well component connected to the second n+ region.

A second aspect of the disclosure provides a method including: removing a first semiconductor layer over a first portion of an integrated circuit to expose a portion of a buried oxide (BOX) layer; etching the exposed portion of the BOX layer to define a buried oxide component, the etching configured to expose a portion of a second semiconductor layer beneath the BOX layer; implanting the exposed portion of the second semiconductor layer; and forming a gate in the first portion of the integrated circuit, the gate including the buried oxide component as gate dielectric material.

A third aspect of the disclosure provides design structure tangibly embodied in a machine readable medium for design, manufacturing, or testing an integrated circuit, the design structure including: a substrate; a first semiconductor layer disposed on the substrate; a shallow trench isolation (STI) extending through the first semiconductor layer to within a portion of the substrate, the STI substantially separating a first n+ region and a second n+ region; and a gate disposed on a portion of the first semiconductor layer and connected to the STI, the gate including: a buried metal oxide (BOX) layer disposed on the first semiconductor layer and connected to the STI; a cap layer disposed on the BOX layer; and a p-type well component disposed within the first semiconductor layer and the substrate, the p-type well component connected to the second n+ region.

BRIEF DESCRIPTION OF THE DRAWINGS

The above and other aspects, features and advantages of the disclosure will be better understood by reading the following more particular description of the disclosure in conjunction with the accompanying drawings.

It is noted that the drawings of the disclosure are not necessarily to scale. The drawings are intended to depict only typical aspects of the disclosure, and therefore should not be considered as limiting the scope of the disclosure. It is understood that elements similarly numbered between the FIGURES may be substantially similar as described with reference to one another. Further, in embodiments shown and described with reference to FIGS. 1-15, like numbering may represent like elements. Redundant explanation of these elements has been omitted for clarity. Finally, it is understood that the components of FIGS. 1-15 and their accompanying descriptions may be applied to any embodiment described herein.

DETAILED DESCRIPTION

Figure 1:
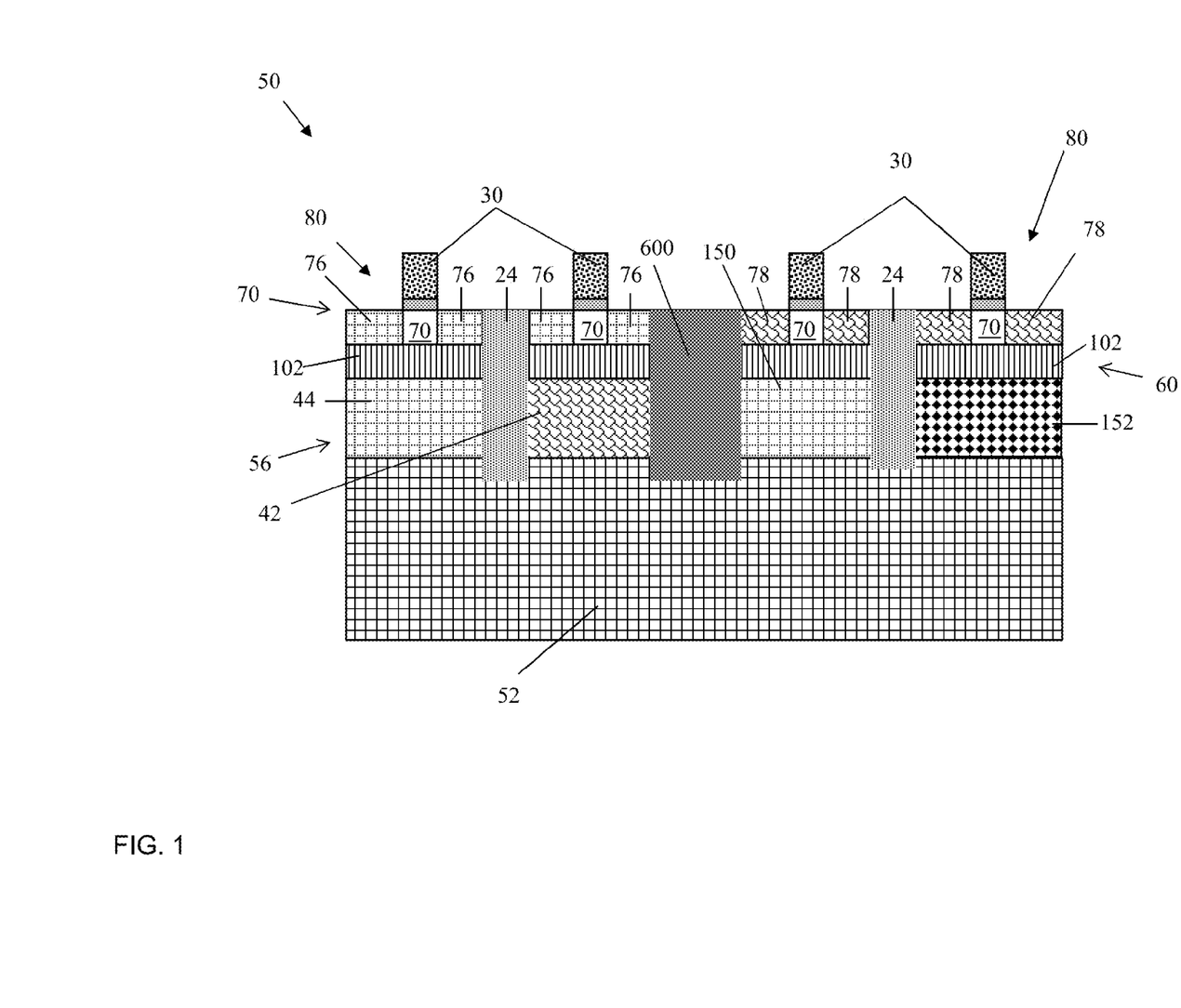
FIG. 1 shows a cross-sectional side view of portions of an integrated circuit.

Turning to the drawings, FIG. 1 shows a cross-sectional view of a portion of an IC 50 including a semiconductor layer 56 (e.g., a silicon layer) disposed (e.g., through selective epitaxial grown) upon a substrate 52. Semiconductor layer 56 may include a first n+ region 44, a first p+ region 42, a second n+ region 150, and a third n+ region 152. In one embodiment, first n+ region 44, first p+ region 42, second n+ region 150, and/or third n+ region 152 may be formed through selective epitaxial growth. A buried oxide (BOX) layer 60 may be disposed on semiconductor layer 56 and a set of shallow trench isolations (STI) 24 may be disposed on opposite sides of a deep trench isolation 600 extending through semiconductor layer 56 and BOX layer 60 to within a portion of substrate 52. A second semiconductor layer 70 may be disposed upon BOX layer 60 and may include a plurality of n+ portions 76 (e.g., an n-type source, an n-type drain, etc.) and a plurality of p+ portions 78 (e.g., a p-type source, a p-type drain, etc.), each distinct from one another. IC 50 may further include a set of gates 30 disposed upon second semiconductor layer 70, forming a set of logic field effect transistors (FET) 80. IC 50 illustrated in FIG. 1 may be consistent with structures and ICs used in leading edge technology.

Figure 2:
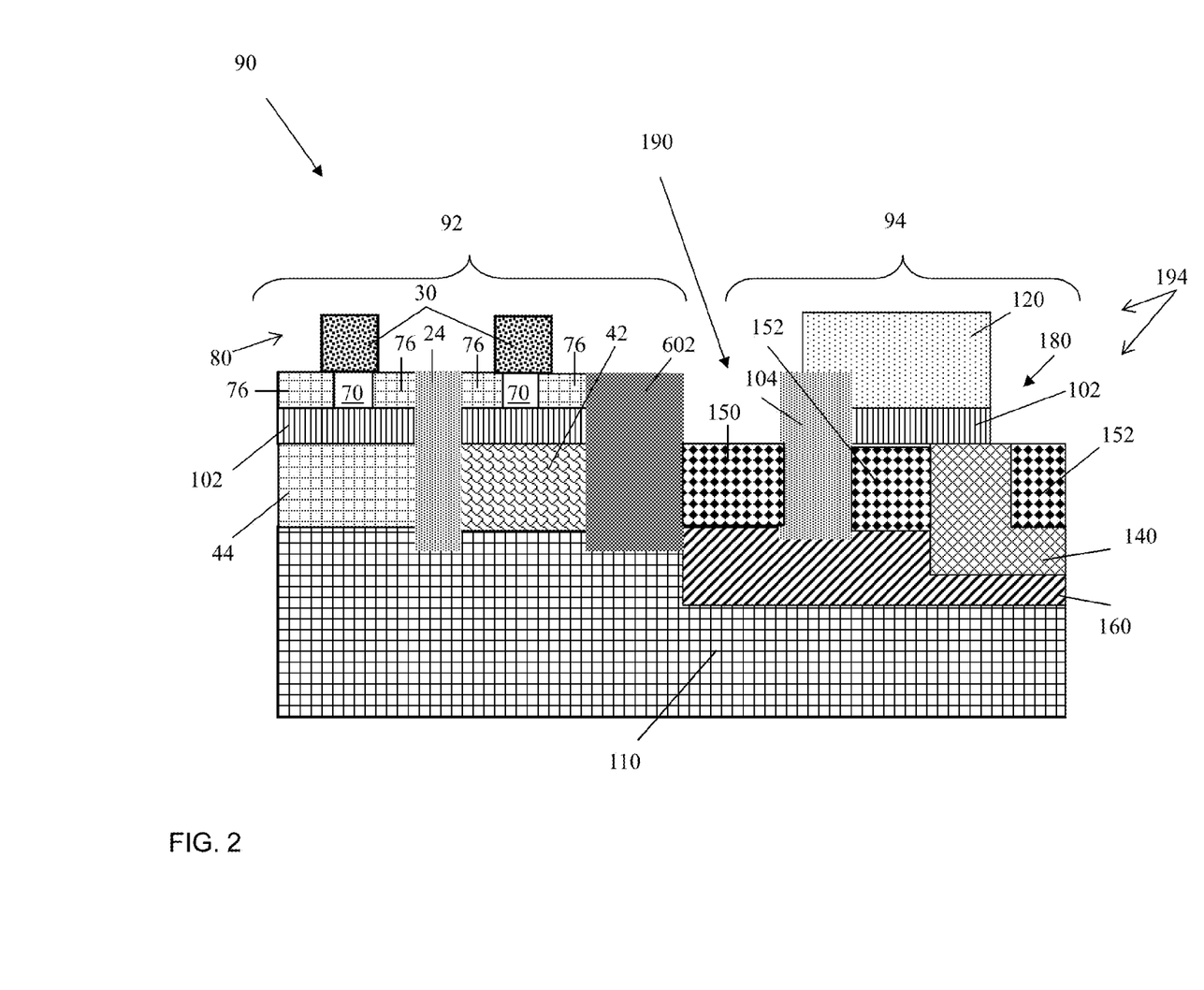
FIG. 2 shows a cross-sectional side view of portions of an integrated circuit according to embodiments of the invention.

Turning to FIG. 2, a cross-sectional side view of portions of an integrated circuit (IC) 90 including a first portion 92 configured as a set of logic field effect transistors (FET) 80, and a second portion 94 configured as a laterally diffused semiconductor transistor 194 (e.g., a laterally diffused metal oxide semiconductor transistor (LDMOS)) is shown according to embodiments. First portion 92 and second portion 94 may be physically separated by a deep trench isolation 602. IC 90 may include a substrate 110 (e.g., wafer) upon which first portion 92 and second portion 94 are disposed. Second portion 94 may include a buried oxide (BOX) portion/component 102 disposed upon a portion of third n+ region 152 and a P-type well (PW) portion 140. An extended n-well region 160 may be disposed beneath portions of second n+ region 150, third n+ region 152, and/or PW portion 140. BOX component 102 may be disposed proximate a shallow trench isolation (STI) 104. A gate 120 (e.g., a polysilicon gate, a metal gate, etc.) may be disposed on and/or about BOX portion 102 and in contact with STI 104. BOX portion 102 may overlap and/or connect to p-type well portion 140 which extends within and/or through third n+ region 152 (e.g., an n+ source). Third n+ region 152 may include a quantity of impurities configured to manipulate an electrical property of portions of third n+ region 152. Second n+ region 150 and third n+ region 152 may be formed as part of the same process step. Second n+ region 150 may be a drain for LDMOS transistor 194 and third n+ region 152 may be a source for LDMOS transistor 194.

In an embodiment, p-type well portion 140 and/or extended nwell drain region 160 may be formed by masked ion implantation. P-type well portion 140 may extend into substrate 110 and substantially separate portions of third n+ region 152, thereby partially defining a source region 180 for LDMOS 194. STI 104 may separate any of BOX portion 102, third n+ region 152, and gate 120, from second n+ region 150 (e.g., an n+ drain) which is disposed on substrate 110, thereby substantially defining a drain region 190 for LDMOS 194. In one embodiment, source region 180 may be physically separated from drain region 190 by BOX portion 102, STI 104, and gate 120. A person skilled in the art will readily recognize that location of structures, elements, components, and portions may be adjusted or modified to meet design and/or performance needs. Further, it is understood that other structures have been omitted for clarity. The omitted structures may include any conventional dielectric spacer, interconnect components, passive devices, etc.

Substrate 110 may be comprised of but not limited to silicon, germanium, silicon germanium, silicon carbide, and those consisting essentially of one or more Group III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Substrate 110 may also be comprised of Group II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The processes to provide substrate 110, as illustrated and described, are well known in the art and thus, no further description is necessary.

As used herein, the term "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Dielectrics described herein may include silicon dioxide ($SiO_2$), silicon nitride (SiN), or any other suitable material. Any number of dielectric layers may be located over the IC/chip body, as many other layers included in semiconductor chips now known or later developed. In one embodiment, dielectric layers may include silicon dioxide ($SiO_2$) for its insulating, mechanical and optical qualities. Dielectric layers may include, but are not limited to: silicon nitride ($Si_3N_4$), fluorinated $SiO_2$ (FSG), hydrogenated silicon oxycarbide (SiCOH), porous SiCOH, boro-phosho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. These dielectric layers may be deposited using conventional techniques described herein and/or those known in the art.

Figure 3:
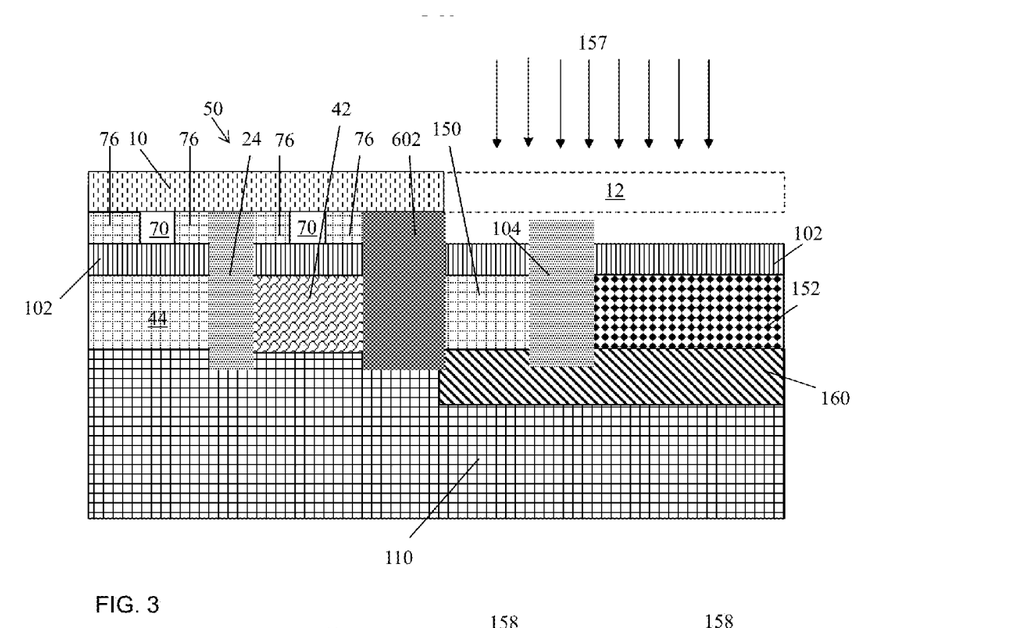
FIGS. 3-6, show cross-sectional views illustrating a method of forming portions of an integrated circuit.

Turning to FIGS. 3-6, cross-sectional views illustrating a process in forming IC 90 (shown in FIG. 2) with second portion 94 configured as LDMOS 194 is shown in accordance with known methods. FIG. 3 shows removal of a portion 12 (shown in phantom) of a third semiconductor layer 10 from IC 50. Portion 12 is located over second portion 94 and removal may include an etch 157 which removes portion 12 in second portion 94. In one embodiment, etch 157 may substantially remove all of portion 12 and portions of second semiconductor layer 70 there below. Etch 157 may include a number of processes, including selective etching, masked etching, or any other now known or to be developed techniques. Removal of second semiconductor layer 70 may include removal of plurality of p+ portions 78 in second portion 94, thereby exposing portions of BOX layer 102 in second portion 94 while not impacting first portion 92. Following etch 157, extended nwell drain region 160 may be formed by selective ion implantation. Implants may include arsenic, phosphorous, antimony, or other known materials. In one embodiment, a mask/pattern of etch 157 may be used for the selective ion implantation.

Figure 4:
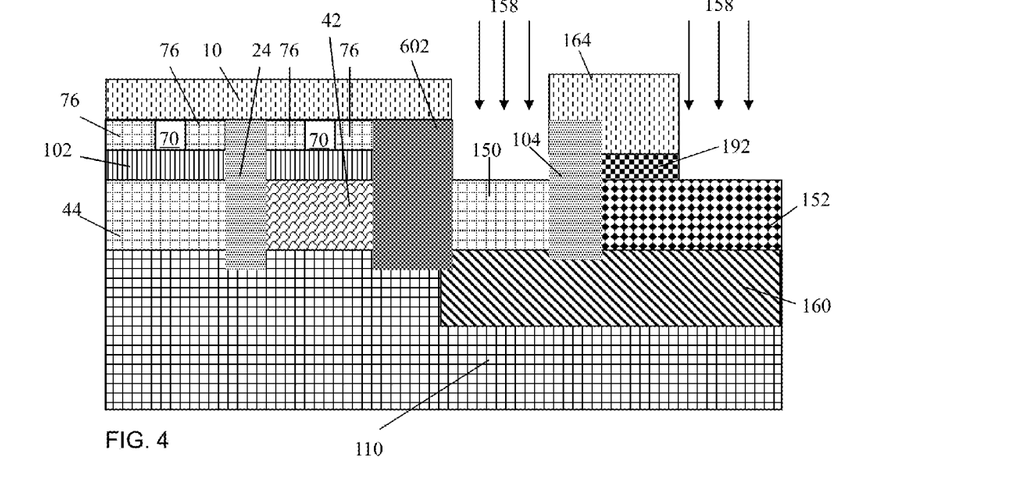
Figure 5:
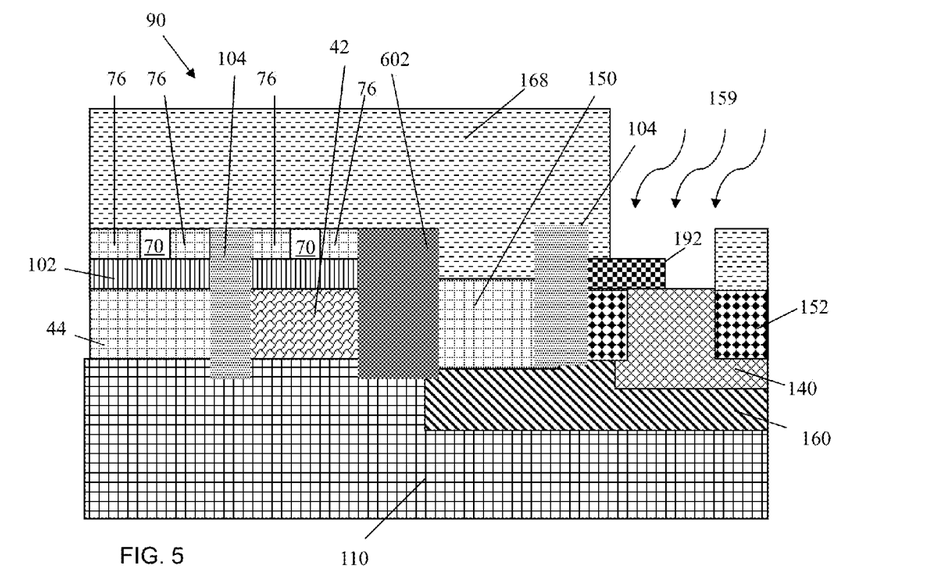
Figure 6:
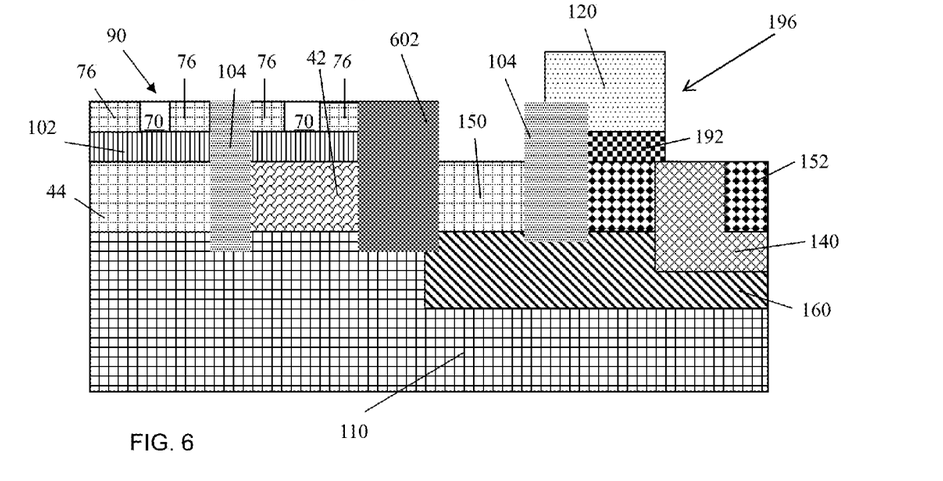

Turning to FIG. 4, following removal of portion 12 of third semiconductor layer 10 and portions of second semiconductor layer 70 in second portion 94, a first mask 164 (e.g., sacrificial polysilicon layer) may be formed on portions of BOX layer 102 and/or STI 104 in second portion 94. First mask 164 may cover portions of first portion 92 and may be formed to cover selected portions of BOX layer 102 (e.g., to form a buried oxide (BOX) component (shown in FIGS. 5-6)). Following formation of first mask 164, a second etch 158 may remove portions of BOX layer 102 in second portion 94 which are not covered by first mask 164. Etch 158 may include a number of processes, including selective etching, masked etching, or any other now known or to be developed techniques. Remaining BOX layer 102 may form a buried oxide component 192 (e.g., a gate oxide portion) and STI 104 may form a drain 190 (e.g., a laterally extended drain) (shown in FIG. 2). Next, as shown in FIG. 5, a second mask 168 is formed over portions of IC 90. Second mask 168 may cover all or portions of first portion 92, second n+ region 150, third n+ region 152, STI 104, and/or BOX component 192. Following formation of second mask 168, an implant 159 may be performed to portions of second portion 94, thereby forming pwell 140. Implant 159 may include implantation of materials into portions of substrate 110 and/or third n+ region 152 forming pwell 140. Doping agents and implants may include, P-type dopants, Boron, Indium, BF2, etc. Following implanting, as shown in FIG. 6, second mask 168 may be removed and gate 120 may be formed on/including buried oxide component 192, thereby forming gate 196. In one embodiment, a portion of second mask 168 and/or first mask 164 may be included as a portion of gate 196. Gate 196 may contact and/or overlap STI 104 as a portion of laterally extended drain 194 and may include substrate 110 as an active component of gate 194. In one embodiment, portions of mask 168 and/or mask 108 may be retained and incorporated as layers and/or components of gate 194. In one embodiment, BOX layer 102 which has been formed into BOX component 192 may be incorporated into a gate dielectric layer for a portion of the gate stack for gate 120 and/or gate 196.

Figure 7:
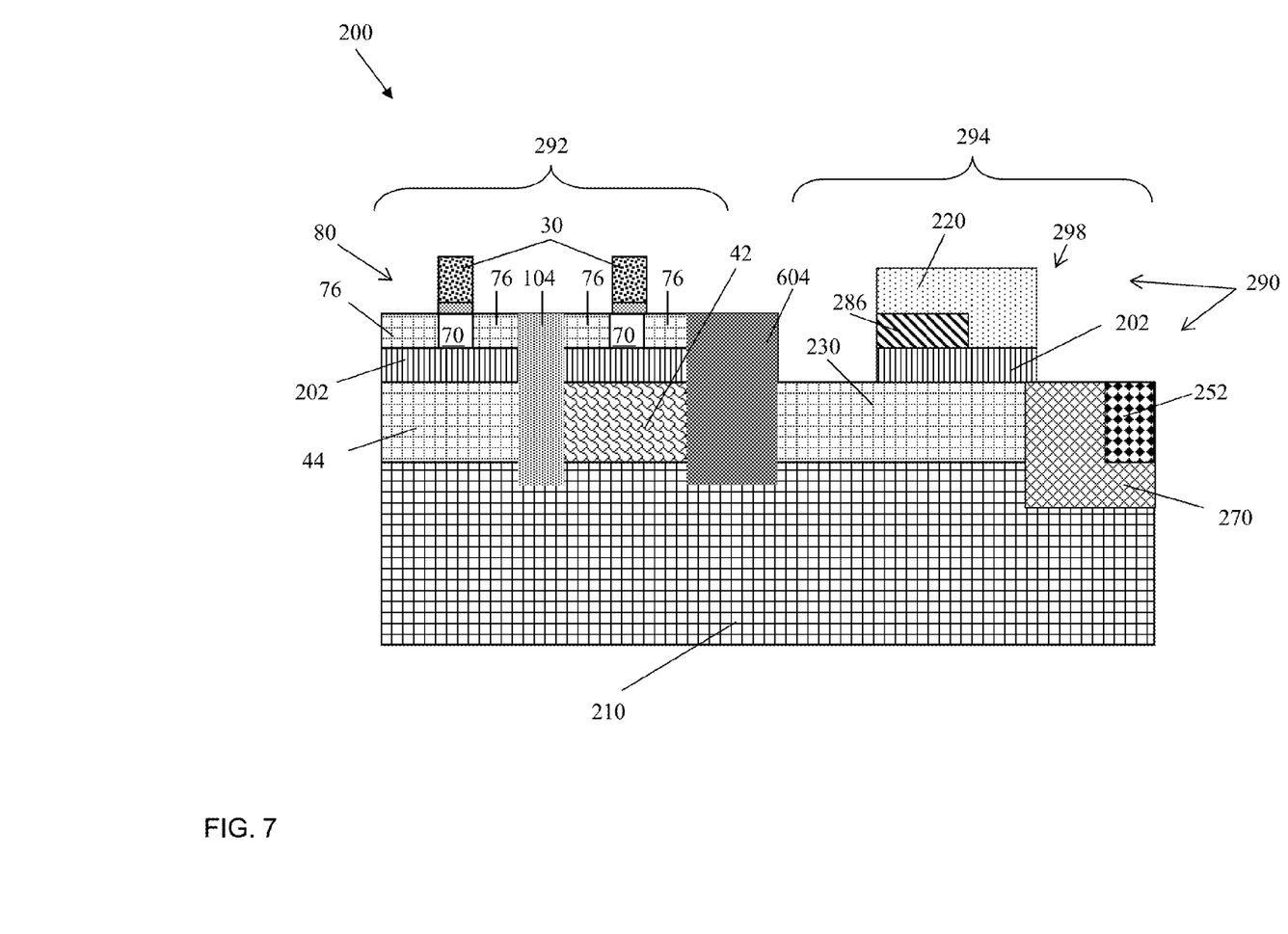
FIG. 7 shows a cross-sectional side view of portions of an integrated circuit according to embodiments of the invention.

Referring to FIG. 7, a cross-sectional side view of portions of an integrated circuit (IC) 200 is shown according to embodiments of the invention. IC 200 includes a first portion 292 configured as a set of logic field effect transistors (FET) 80 and a second portion 294 configured as a laterally diffused metal oxide semiconductor transistor (LDMOS) 290. First portion 292 and second portion 294 may be physically separated by a deep trench isolation 604. Second portion 294 includes a first n+ portion 230 (e.g., an N+ drain) disposed on a substrate 210 proximate a P-type well 270. A second N+ region 252 (e.g., an N+ source) may be disposed in Pwell 270, and a buried oxide (BOX) layer/component 202 may be disposed on portions of first n+ portion 230 and Pwell 270. An oxide layer 286 (e.g., tetra-ethyl-ortho-silicate (TEOS)) and a poly-silicon layer 220 may be formed on BOX layer 202 and configured to form a gate 298.

Figure 8:
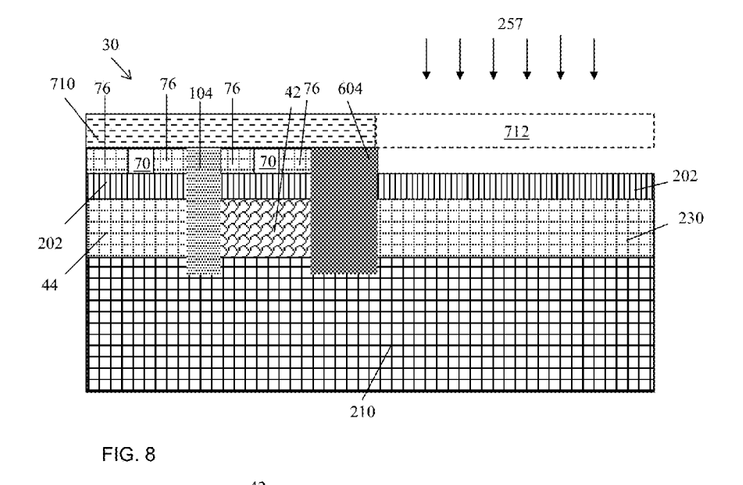
FIGS. 8-12, show cross-sectional views illustrating a method of forming portions of an integrated circuit according to embodiments of the invention.

Turning to FIGS. 8-12, cross-sectional views illustrating a process in forming IC 200 (shown in FIG. 7) with LDMOS 290 including a gate 298 from an IC 30 is illustrated according to embodiments of the invention. In FIG. 8, selected portions of material are removed from an IC 30. In one embodiment, a portion 712 (shown in phantom) of a third semiconductor layer 710 is removed from IC 30. Portion 712 is located over second portion 294 and removal may include an etch 257 which removes portion 712 in second portion 294. In one embodiment, etch 257 may substantially remove all of portion 712 and portions of second semiconductor layer 70 there below. Etch 257 may include a number of processes, including selective etching, masked etching, or any other now known or to be developed techniques. Removal of second metal layer 70 may include removal of plurality of p+ portions 78 in second portion 294, thereby exposing portions of BOX layer 202 in second portion 294 while not impacting first portion 292.

In another embodiment, etching of IC 50 may be performed using a reactive ion etch (RIE). As is known in the art of semiconductor fabrication, RIE uses chemically reactive plasma to remove material deposited on wafers/substrates. Differences in width between these openings may allow for utilizing a phenomenon known as inverse RIE lag. Inverse RIE lag, as is known in the art of semiconductor fabrication, causes a faster etch rate in narrower openings (higher aspect ratios) than in openings having larger widths (lower aspect ratios). Inverse RIE lag may be induced under any conditions characterized by high polymerization and high wafer self-bias voltages. In one embodiment, conditions characterized by high polymerization, may include general chemistries such as CxHyFz (Carbon-Hydrogen-Flourine) with high oxide-to-nitride selectivity (where the blanket etch rate ratio is greater than approximately 20:1). In another embodiment, conditions characterized by high polymerization may include $O_2$ (oxygen), a dilutant, and one or more of: $C_4F_6$, $C_5F_8$, or $C_4F_8$. In this case, the dilutant may be, for example, Argon (Ar). High wafer self-bias voltages may, for example, be voltages greater than approximately 500 volts. While specific conditions for facilitating inverse RIE lag are described herein, those conditions are merely illustrative. Inverse RIE lag may be induced under other conditions not specifically described herein.

In any event, IC 30 may be etched to form a second portion 294 with an exposed portion of BOX layer 202. In one embodiment, third semiconductor layer 710 may have a thickness of about 6 nanometers to about 8 nanometers, and BOX layer 202 may have a thickness of about 10 nanometers to about 20 nanometers. Third semiconductor layer 710 may include silicon and BOX layer 202 may include an oxide, a thermal oxide, or any other dielectric described herein or known.

Figure 9:
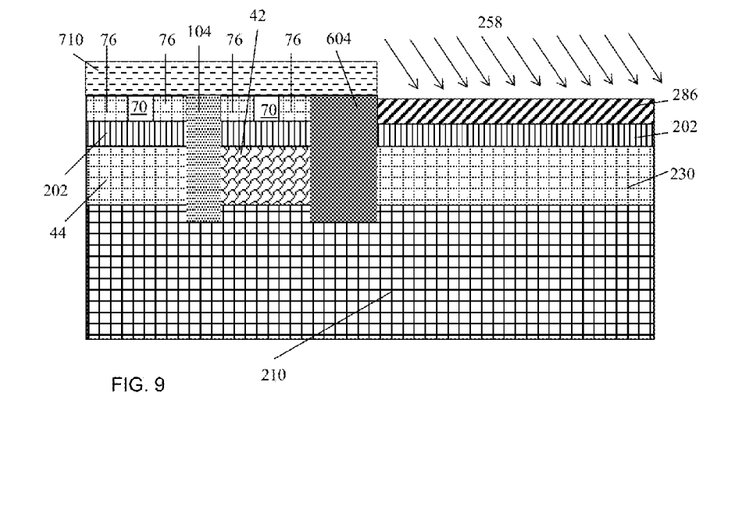
Figure 10:
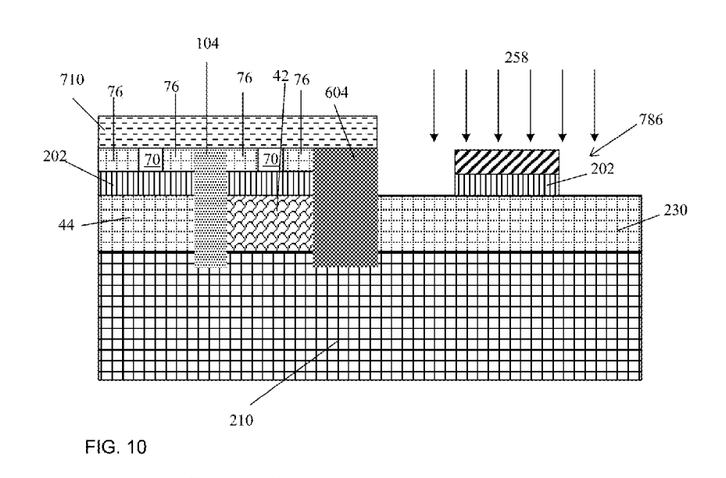
Figure 11:
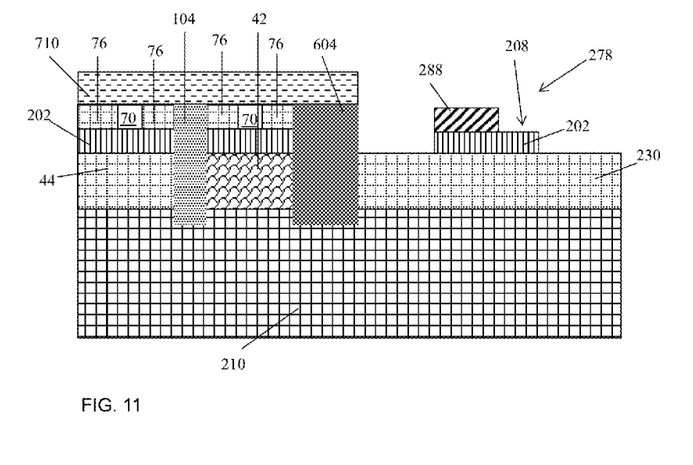
Figure 12:
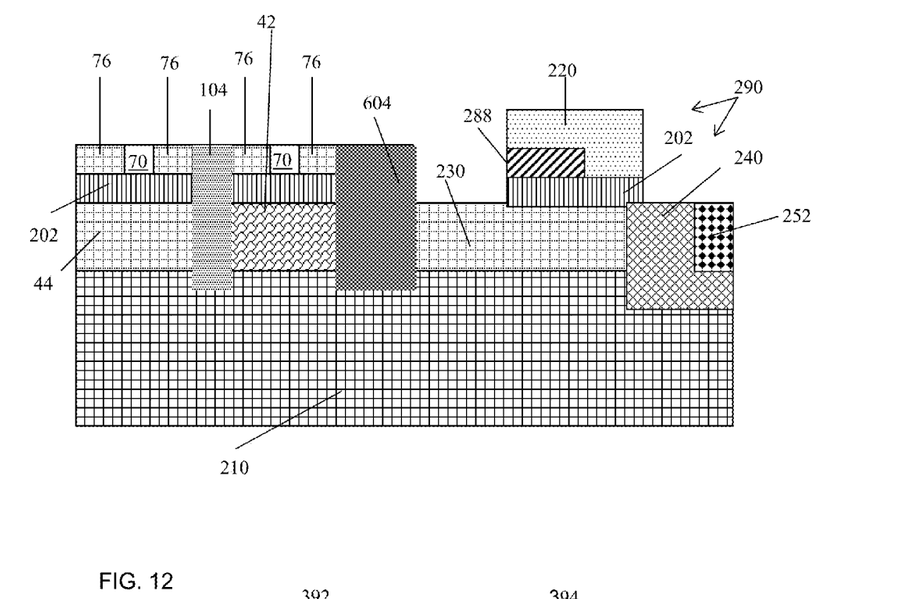

Following etch 257 to expose box layer 202 in second portion 294, as shown in FIG. 9, an oxide layer 286 (e.g., a tetra-ethyl-ortho-silicate (TEOS)) is formed on exposed portions according to embodiments of the invention. Oxide layer 286 may be formed using any now known or later developed techniques. Following deposition of Oxide layer 286, as shown in FIG. 10, a second etch 258 may be performed to remove portions of BOX layer 202 and oxide layer 286, and form an oxide component 786 (e.g., a buried oxide component). Second etch 258 may selectively remove portions of BOX layer 202 and oxide layer 286 to form a shape/pattern in second portion 294, and may include a number of processes, including selective etching, masked etching, or any other now known or to be developed techniques. Remaining BOX layer 202 and oxide layer 286 may form oxide component 786 (e.g., a gate oxide portion). In one embodiment, shown in FIG. 11, an optional process is shown for forming a stepped oxide component 278 on IC 200 according to embodiments of the invention. In this embodiment, oxide layer 286 may be selectively etched as a part of etch 258 or as a separate step, to expose a portion 208 of BOX layer 202. A remaining portion 288 of oxide layer 286 may remain on BOX layer 202. Next, as shown in FIG. 12, an implant may be performed to portions of second portion 294, thereby forming pwell 240. The implant may include implantation of materials into portions of substrate 210 and/or n+ region 230 forming pwell 140 and isolating second n+ region 252. Following the implant, a gate 290 may be formed by deposition of a cap layer 220 (e.g., silicon) on BOX layer 202 and oxide layer 286. In one embodiment, cap layer 220 may be formed during either or both of etch 258 and etch 257, cap layer 220 including portions of a sacrificial layer and/or mask used during the etches.

Figure 13:
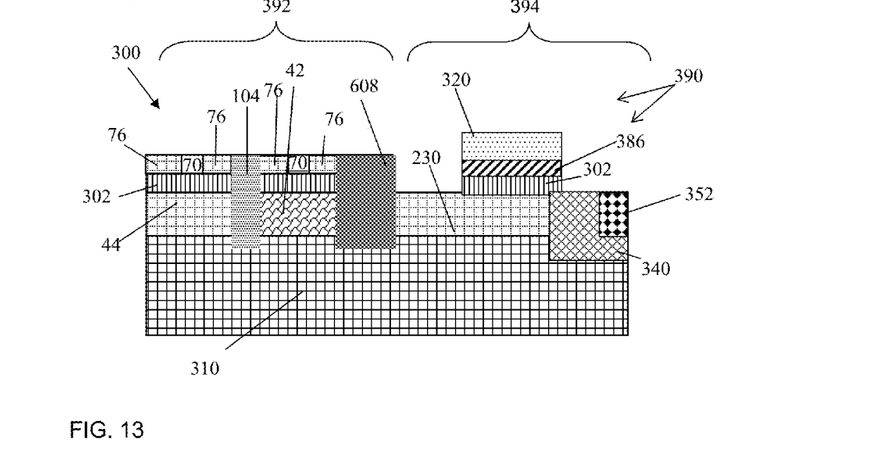
FIG. 13 shows a cross-sectional side view of portions of an integrated circuit according to embodiments of the invention.
Figure 14:
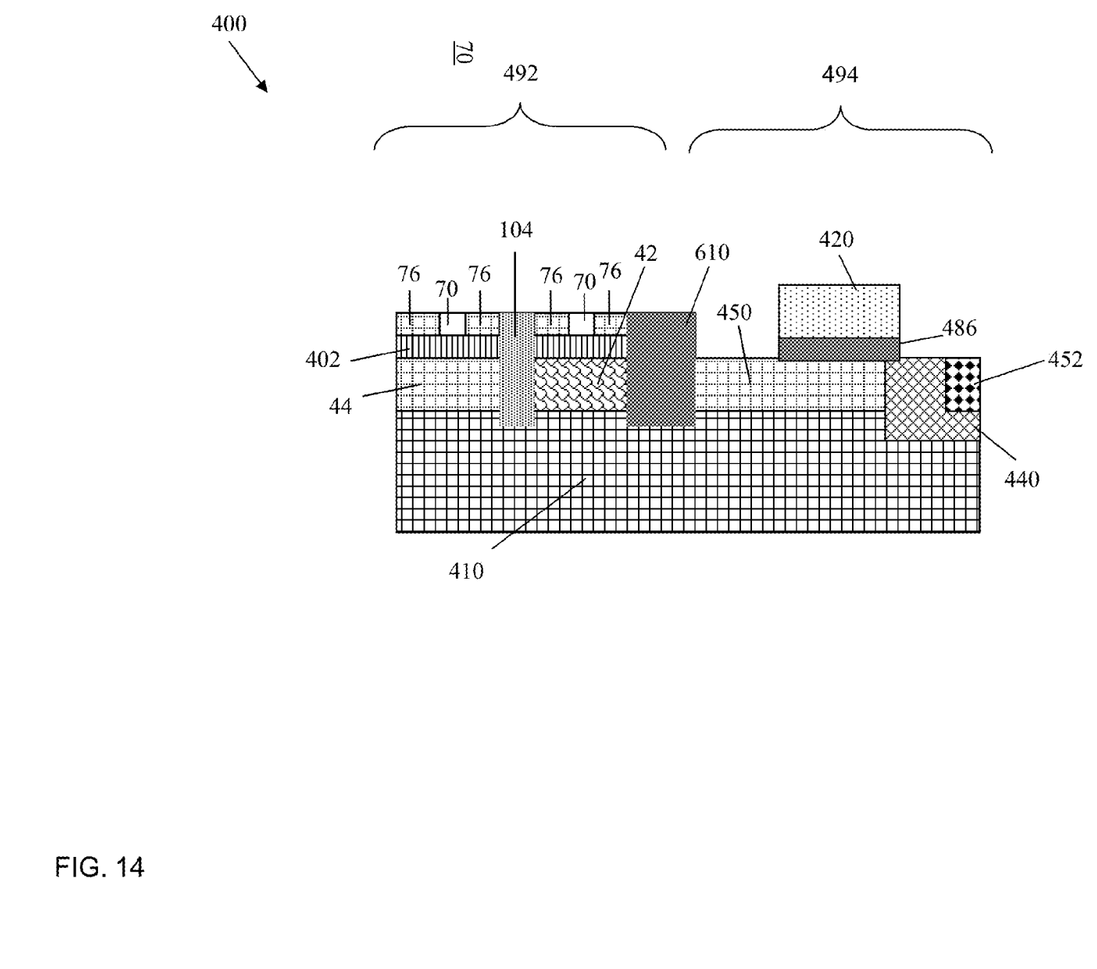
FIG. 14 shows a cross-sectional side view of portions of an integrated circuit according to embodiments of the invention.

Referring to FIG. 13, a cross sectional side view of one embodiment of an integrated circuit (IC) 300 is shown in accordance with embodiments of the invention. In this embodiment, a TEOX layer 386 physically separates a buried oxide (BOX) layer 302 and a polysilicon gate layer 320. TEOX layer 386 and/or BOX layer 302 may form a gate dielectric for a gate stack 390. P-type well 340 may be formed by masked implants as described herein. In one embodiment, n+ region 150 and P-type well 340 may be the only connections between substrate 310 and box layer 302. A first N+ region 230 and a second N+ region 352 may form the source and drain portions for gate stack 390. In this embodiment, first portion 392 and second portion 394 may be physically separated by a deep trench isolation 608. Turning to FIG. 14, a cross-sectional side view of one embodiment of an integrated circuit (IC) 400 is shown in accordance with embodiments of the invention. In this embodiment, a box component 486 is formed directly on an n+ region 450 and pwell 440 without an STI. In one embodiment, first portion 492 and second portion 494 may be physically separated by a deep trench isolation 610.

Figure 15:
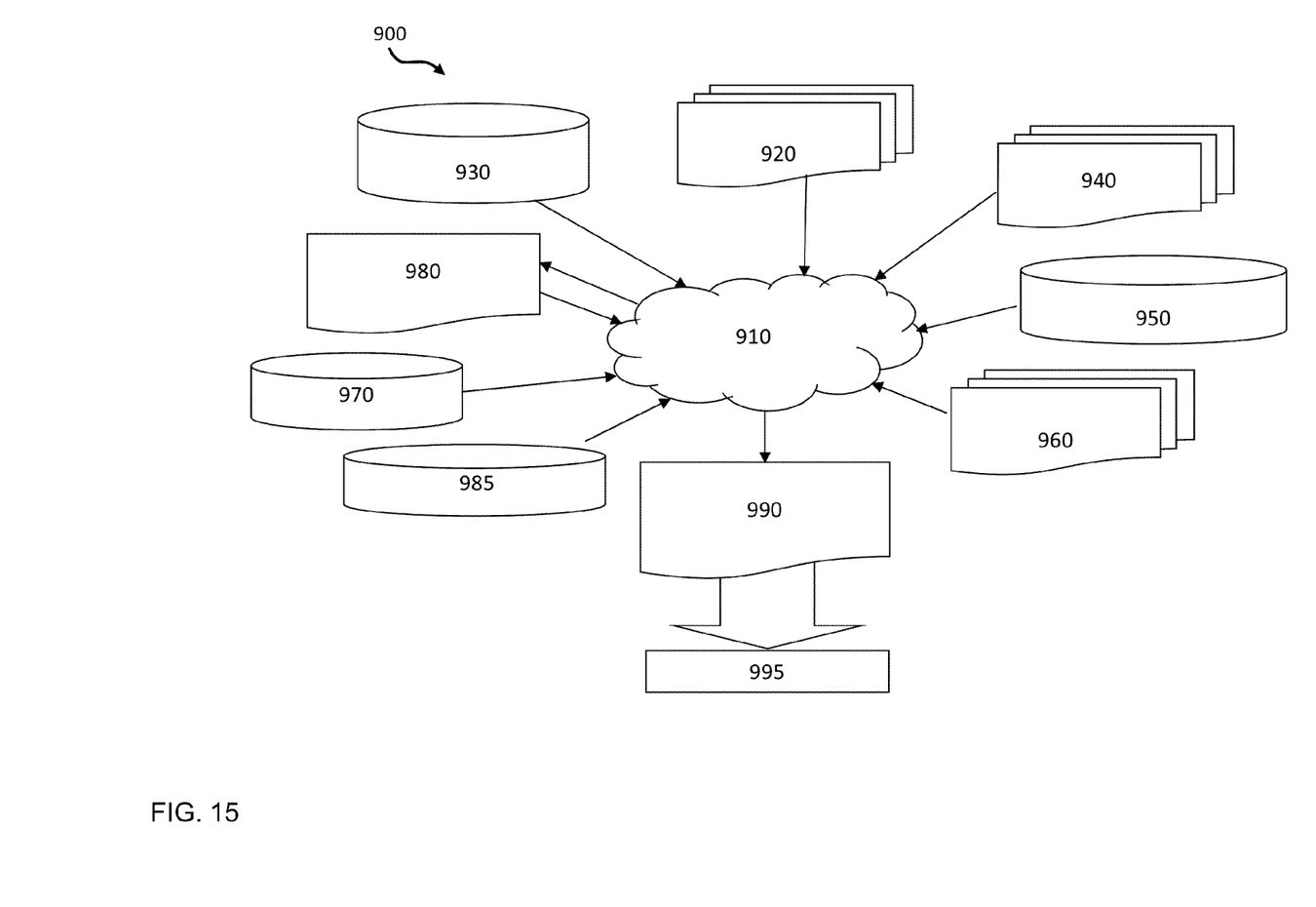
FIG. 15 is a flow diagram of a design process used in semiconductor design, manufacture, and/or test according to embodiments of the invention.

FIG. 15 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-14. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 15 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-14. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-14 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-14. In one embodiment, design structure 990 may comprise a compiled, executable HDL simulation model that functionally simulates the devices shown in FIGS. 1-14.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-14. Design structure 990 may then proceed to a stage 995 where, for example, design structure 990: proceeds to tape-out, is released to manufacturing, is released to a mask house, is sent to another design house, is sent back to the customer, etc.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An integrated circuit comprising:
   a substrate;
   a first semiconductor layer disposed on the substrate;
   a shallow trench isolation (STI) extending through the first semiconductor layer to within a portion of the substrate, the STI substantially separating a first n+ region and a second n+ region; and
   a gate disposed on a portion of the first semiconductor layer and connected to the STI, the gate including:
      a buried metal oxide (BOX) layer disposed on the first semiconductor layer and connected to the STI;
      a cap layer disposed on the BOX layer; and
      a p-type well component disposed within the first semiconductor layer and the substrate, the p-type well component connected to the second n+ region.

2. The integrated circuit of claim 1, wherein the BOX layer has a thickness of about 10 nanometers to about 20 nanometers.

3. The integrated circuit of claim 1, further comprising an oxide layer disposed beneath the cap layer upon a portion of the BOX layer.

4. The integrated circuit of claim 3, wherein the oxide layer is configured to expose a portion of the BOX layer to the cap layer.

5. The integrated circuit of claim 1, further comprising a field effect transistor disposed laterally proximate the gate on the substrate.

6. The integrated circuit of claim 1, wherein the cap layer includes sacrificial silicon.

7. The integrated circuit of claim 1, wherein the substrate is actively connected to the gate and the gate forms a high voltage FET.

8. A design structure tangibly embodied in a non-transitory machine readable medium for design, manufacturing, or testing an integrated circuit, the design structure comprising:
   a substrate;
   a first semiconductor layer disposed on the substrate;
   a shallow trench isolation (STI) extending through the first semiconductor layer to within a portion of the substrate, the STI substantially separating a first n+ region and a second n+ region; and
   a gate disposed on a portion of the first semiconductor layer and connected to the STI, the gate including:
      a buried metal oxide (BOX) layer disposed on the first semiconductor layer and connected to the STI;
      a cap layer disposed on the BOX layer; and
      a p-type well component disposed within the first semiconductor layer and the substrate, the p-type well component connected to the second n+ region.

9. The design structure of claim 8, wherein the BOX layer has a thickness of about 10 nanometers to about 20 nanometers.

10. The design structure of claim 8, further comprising an oxide layer disposed beneath the cap layer upon a portion of the BOX layer.

11. The design structure of claim 10, wherein the oxide layer is configured to expose a portion of the BOX layer to the cap layer.

12. The design structure of claim 8, wherein the substrate is actively connected to the gate.

\* \* \* \* \*